United States Patent [19]

Rhodes

[11] Patent Number: 4,804,438
[45] Date of Patent: Feb. 14, 1989

[54] METHOD OF PROVIDING A PATTERN OF CONDUCTIVE PLATINUM SILICIDE

[75] Inventor: Howard E. Rhodes, Webster, N.Y.

[73] Assignee: Eastman Kodak Company, Rochester, N.Y.

[21] Appl. No.: 153,373

[22] Filed: Feb. 8, 1988

[51] Int. Cl.$^4$ .................. B44C 1/22; C03C 15/00; C03C 25/06; C23F 1/00

[52] U.S. Cl. .................. 156/653; 156/656; 156/657; 156/569.1; 252/79.2; 252/79.3; 427/294; 427/399; 437/201; 437/202; 437/228; 437/245

[58] Field of Search ............... 437/178, 179, 201, 202, 437/245, 247, 238, 39, 228; 427/61, 404, 294, 399; 156/628, 653, 655, 656, 657, 659.1, 662, 668; 357/67, 30; 252/79.2, 79.3

[56] References Cited

U.S. PATENT DOCUMENTS

| | | | |
|---|---|---|---|
| 3,889,359 | 6/1975 | Rand | 437/201 X |
| 3,924,320 | 12/1975 | Altman et al. | 437/178 X |
| 4,455,738 | 6/1984 | Houston et al. | 437/201 X |
| 4,590,093 | 5/1986 | Woerlee et al. | 427/79 |

Primary Examiner—William A. Powell
Attorney, Agent, or Firm—Raymond L. Owens

[57] ABSTRACT

In order to provide a pattern of conductive platinum silicide on a silicon substrate, a layer of platinum is deposited in an atmosphere having a vacuum of $10^{-8}$ Torr or less on a silicon substrate which was previously provided with selected oxide regions. This prevents oxygen from contaminating the deposited platinum layer. The substrate is then annealed for the first time in an atmosphere of $10^{-8}$ Torr or less to form a platinum silicide pattern in regions in which the deposited platinum directly contacts the silicon substrate. The substrate is then annealed for a second time in an atmosphere oxygen to form a protective oxide layer over the silicide. Next the unreacted platinum deposited on the oxide regions is electively removed by an aqua regia wet etch.

4 Claims, 1 Drawing Sheet

METHOD OF PROVIDING A PATTERN OF CONDUCTIVE PLATINUM SILICIDE

FIELD OF THE INVENTION

This invention relates to forming patterns of conductive platinum silicide on a silicon substrate.

BACKGROUND OF THE INVENTION

Advances in electronic technology cause integrated circuits to be formed on silicon substrates with ever increasing packing density of active components. Conductive platinum silicide can advantageously be used to form diodes which are infrared light sensitive.

One technique for forming such a conductive layer on an integrated circuit is to deposit a film of platinum metal onto the wafer by sputtering. The wafer is then typically annealed at 300° C. to 700° C. in either vacuum or inert ambient (such as nitrogen) to form conductive films of platinum silicide on regions of the wafer where the platinum metal is in intimate contact with exposed silicon substrate. Unreacted platinum metal on oxidized regions do not form platinum silicide and are removed in a subsequent aqua regia etch. In this manner isolated, conducting regions of platinum silicide are formed which will give the integrated circuit its infrared response.

In U.S. Pat. No. 4,590,093 to Woerlee et al., the platinum metal was deposited by sputtering. Due to both the high velocity of the deposited platinum atoms and the high velocity of the inert atoms that are present in a sputtering ambient, the bare silicon regions on the substrate can be damaged. This deposited film is also contaminated with oxygen from the sputtering ambient.

The performance of platinum silicide formed in the above manner is low due to three factors. The first results from the fact that sputtering is a relatively high energy process. During the sputtering of any metal the atoms (platinum in this case) strike the wafer with high velocity and damage the exposed silicon. This damage reduces the performance of the integrated circuit.

A second problem is that sputtering is performed in an inert gas ambient such as argon. This inert gas is ionized, bombards the silicon substrate at high velocity and also causes damage with a consequent reduction in electrical performance.

A third problem with this technique is that the inert gas is often contaminated with oxygen. Commercially available inert gas sources often provide gases that are not sufficiently pure. Oxygen impurities can be a particular problem in that during deposition they form a silicon oxide phase that interferes with the platinum silicide formation. This gives rise to inferior electrical performance. Thereafter, the contaminated platinum metal is annealed in vacuum or a controlled ambient.

Another technique used to deposit platinum metal is by electron-beam evaporation in a high vacuum (typically $10^{-5}$ to $10^{-7}$ Torr). In this technique platinum atoms strike the silicon substrate at much lower velocity and so damage to the substrate surface is reduced. However, a vacuum of $10^{-5}$ to $10^{-7}$ Torr is not good enough to prevent the deposited platinum film from being contaminated with oxygen. The subsequent anneal step takes place in either a vacuum or a controlled ambient, to form the platinum silicide. Since the platinum metal has already been contaminated with oxygen, the silicon oxide phase forms and disrupts the silicide formation during the anneal step.

A third technique that is used to deposit platinum metal is by electron-beam evaporation in ultra-high vacuum (less than $10^{-8}$ Torr). As described above, damage to the silicon substrate is avoided. The vacuum is sufficient so that oxygen contamination of the deposited platinum film is also avoided. If the platinum metal is annealed in ultra-high vacuum either by depositing the platinum onto a heated substrate or by a separate ultra-high vacuum (UHV) anneal, a high quality platinum silicide with excellent electrical performance is obtained. The problem with this technique becomes apparent during the aqua regia etch step to remove any unreacted platinum metal that forms over oxide regions on the wafer. During application of this aqua regia etch, the high quality platinum silicide is also attacked. Where platinum silicide is attacked, desirable properties such as the infrared sensitivity of the integrated circuits are adversely affected.

SUMMARY OF THE INVENTION

The object of this invention is to provide a method for forming a pattern of conductive platinum silicide on a substrate which eliminates the problems discussed above.

A method in accordance with this invention provides a pattern of conductive platinum silicide on a silicon substrate having selective oxide regions by performing steps in the following order:

(a) depositing a layer of platinum in an atmosphere having a vacuum of $10^{-8}$ Torr or less on a silicon substrate on which was previously provided with selective oxide regions;

(b) annealing for the first time, the substrate at a temperature of between about 250°–800° C. in an atmosphere of $10^{-8}$ Torr or less to form a platinum silicide in regions in which the deposited platinum directly contacts silicon;

(c) annealing for the second time, the substrate in an atmosphere having oxygen to form a protective oxide layer over the silicide; and (d) selectively removing the unreacted platinum deposited on the oxide regions by an aqua regia wet etch.

A feature of this invention is that platinum silicide can be used as the sensing element of image sensors which respond to light in the infrared region of the spectrum.

BRIEF DESCRIPTION OF THE DRAWINGS

The invention will be better understood from the following more detailed description taken with respect to the accompanying drawings in which.

MODES OF CARRYING OUT THE INVENTION

Figure 1:
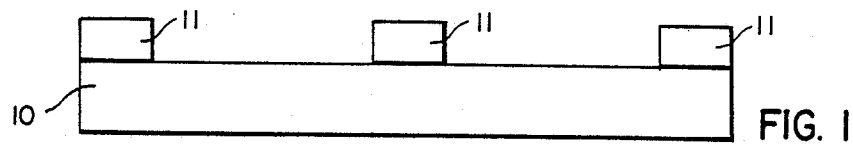
FIGS. 1–5 illustrate the basic sequence of steps in a method for forming a pattern of conductive platinum silicide on a silicon substrate in accordance with the invention. It will be appreciated that for purposes of exposition, the dimensions are not to scale since the various dimensions particularly in the vertical direction of the drawing are quite small. It will also be understood that corresponding parts are designated by the same reference numerals in these figures.

With reference to FIG. 1, there is shown a portion of a silicon wafer 10 which may have been advantageously doped with p-type boron dopant atoms. After appropriately cleaning the substrate 10, an oxide layer 11 is grown or deposited by well-known techniques. The thickness of this oxide layer 11 is not critical. Oxide layer 11 is then patterned by techniques well-known in the semiconductor industry, typically using photoresist. Open regions in the oxide layer 11 are then etched to expose the underlying bare silicon 10. If the oxide is etched using a plasma etch, the masking material must be removed. The substrate is cleaned again, and the substrate annealed at high temperature to remove damage to the silicon substrate produced during the plasma etch. If this etch is advantageously done wet using an etchant containing HF, high temperature anneal is not required as the wet etch does not damage the exposed silicon surface. The masking material is advantageously removed using wet etch chemistry as this also avoids damage to the silicon substrate. Prior to inserting the substrates into a UHV metal deposition chamber, the cleaned substrates are dipped into an HF-containing solution to remove an residual oxide over the bare silicon regions on the substrate.

Figure 2:
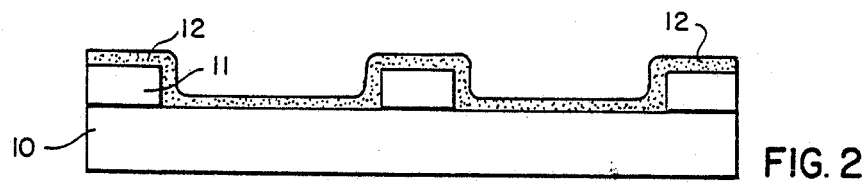

With reference to FIG. 2, a platinum metal film layer 12 is now deposited in a ultra high vacuum (UHV) chamber that has a base pressure of $10^{-8}$ Torr or less. It is critical that this deposition be performed under a ultra-high vacuum to eliminate oxygen contamination in the deposited platinum film.

Figure 3:
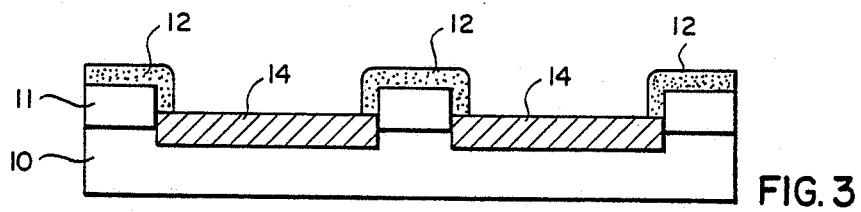

As shown in FIG. 3, the substrate 10 is annealed in the same chamber to form platinum silicide 14 where the platinum is in intimate contact with regions of bare silicon. This anneal step is performed at temperatures from 250° C. to 700° C. Where the platinum metal contacts silicon oxide layer 11, it remains as unreacted platinum metal 12 during this anneal step. It is critical that UHV vacuum conditions be maintained during this anneal step so that the formed platinum silicide does not become contaminated with oxygen. This provides good control over the quality of the platinum silicide film both as to the uniformity of the platinum silicide phase formed and the quality of the platinum silicide/silicon interface.

Figure 4:
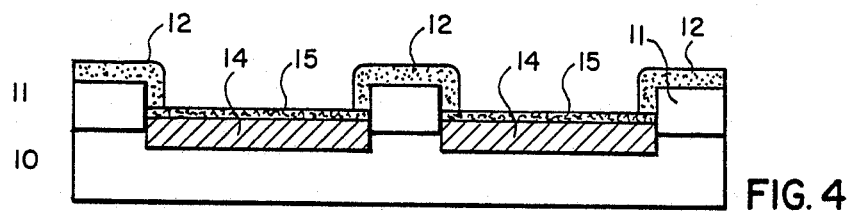

As shown in FIG. 4, the substrate 10 is next annealed in an oxygen-containing ambient at a temperature sufficient to form a protective oxide layer 15 over the platinum silicide layer 14. This temperature should exceed 300° C. This protective oxide layer is required to prevent the aqua regia etchant from attacking the platinum silicide.

Figure 5:
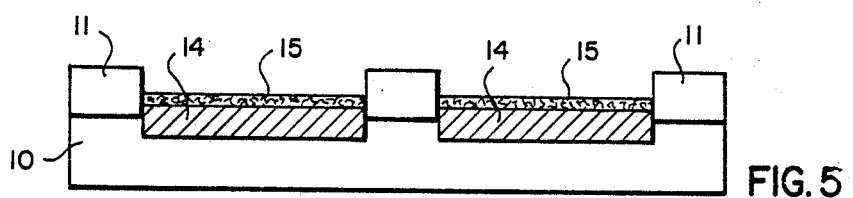

An aqua regia etchant is next used to remove the unreacted platinum metal 12 over the oxide regions layer 11. FIG. 5 shows the finished process with this unreacted platinum metal removed.

EXAMPLE

A 1400 A° thermal oxide was grown on p-type silicon wafers with a resistivity of 5 ohm-cm. Using photoresist, the wafers were patterned using well-known techniques. The wafers were then put into an HF-containing etchant, BOE 1235. Oxide regions that were not covered by photoresist were completely removed revealing the underlying bare silicon. The oxide was etched using a wet etchant to avoid damage to the silicon substrate that is caused by a plasma oxide etch. The photoresist was then removed using a wet etchant containing sulfuric acid and hydrogen peroxide. A wet etchant was used to avoid damage to the silicon substrate which results from stripping the photoresist using plasma etch process. The wafers were then cleaned by placing them in a solution of ammonium hydroxide and hydrogen peroxide, rinsing the wafers in deionized water, placing them in a solution of hydrochloric acid and hydrogen peroxide, rinsing the wafers again in deionized water and then spin drying them. The wafers were then dipped into a solution of hydrofluoric acid and deionized water, rinsed in deionized water, dried, and then immediately inserted into a Vacuum Generators Molecular Beam Epitaxy (MBE) system. The base pressure in this system was $2 \times 10^{-11}$ Torr. The wafers were heated to approximately 350° C. While the wafers were held at 350° C., 90 Angstroms of platinum metal was deposited. Depositing the metal at 90 angstroms or less will improve the infrared response of the deposited metal. During this deposition, the pressure was always below $2 \times 10^{-10}$ Torr. The substrates were then annealed in this UHV chamber at a temperature of approximately 350° C. for 1 hour with the pressure being maintained always less than $1 \times 10^{-10}$ Torr. The wafers were next removed from the UHV system and oxygen annealed at 340° C. in air at atmospheric pressure. The wafers were placed in a aqua regia wet etch at a temperature of 85° C. for 90 seconds. The composition of the aqua regia etchant was three (3) parts (volume) hydrochloric acid, one (1) part (volume) nitric acid, and four (4) parts (volume) deionized water. If the step of oxygen anneal at 340° C. was omitted the platinum silicide regions would have been attacked by the aqua regia etch.

A 256×256 IR CCD image sensor using this platinum silicide process was successfully fabricated and tested.

What is claimed is:

1. A method of providing a pattern of conductive platinum silicide on a silicon substrate having selective oxide regions comprising in the following order the steps of:
    (a) depositing a layer of platinum in an atmosphere having a vacuum of $10^{-8}$ Torr or less on a silicon substrate;
    (b) annealing for the first time, the substrate at a temperature of between about 250°–800° C. in an atmosphere of $10^{-8}$ Torr or less to form a platinum silicide in regions in which the deposited platinum directly contacts silicon;
    (c) annealing for the second time, the substrate in an atmosphere having oxygen to form a protective oxide layer over the silicide; and
    (d) selectively removing the unreacted platinum deposited on the oxide regions by an aqua regia wet etch.

2. The method of claim 1 wherein the aqua regia etch comprises three parts, by volume, hydrochloric acid, one part, by volume, nitric acid and four parts, by volume, deionized water.

3. The method of claim 1 wherein the oxide regions are etched using HF-containing chemicals to avoid plasma etch damage to the silicon surface.

4. The method of claim 1 wherein the platinum thickness is deposited at 90 Angstroms or less to improve infrared response.

* * * * *